US012638501B2

(12) United States Patent
De La Puente et al.

(10) Patent No.: US 12,638,501 B2
(45) Date of Patent: May 26, 2026

(54) PROCESSOR TEST PATTERN GENERATION AND APPLICATION FOR TESTER SYSTEMS

(71) Applicant: ADVANTEST CORPORATION, Tokyo (JP)

(72) Inventors: Edmundo De La Puente, San Jose, CA (US); Mei-Mei Su, San Jose, CA (US); Srdjan Malisic, San Jose, CA (US)

(73) Assignee: Advantest Corporation, Tokyo (JP)

( * ) Notice: Subject to any disclaimer, the term of this patent is extended or adjusted under 35 U.S.C. 154(b) by 387 days.

(21) Appl. No.: 18/230,003

(22) Filed: Aug. 3, 2023

(65) Prior Publication Data

US 2024/0118340 A1     Apr. 11, 2024

Related U.S. Application Data

(60) Provisional application No. 63/440,607, filed on Jan. 23, 2023, provisional application No. 63/407,081, filed on Sep. 15, 2022.

(51) Int. Cl.
*G01R 31/3181* (2006.01)
*G01R 31/317* (2006.01)
*G01R 31/3185* (2006.01)

(52) U.S. Cl.
CPC . *G01R 31/31813* (2013.01); *G01R 31/31724* (2013.01); *G01R 31/318544* (2013.01)

(58) Field of Classification Search
CPC ........ G01R 31/31813; G01R 31/31724; G01R 31/318544
See application file for complete search history.

(56) References Cited

U.S. PATENT DOCUMENTS

2014/0189452 A1* 7/2014 Sonawane ...... G01R 31/318552
714/727
2018/0196103 A1* 7/2018 Champoux ...... G01R 31/31908
(Continued)

FOREIGN PATENT DOCUMENTS

CN            113514759 A    10/2021
KR    10-2013-0084611 A    7/2013
(Continued)

*Primary Examiner* — Catherine T. Rastovski
*Assistant Examiner* — Nyla Gavia

(57) ABSTRACT

A tester system includes a test computer system for coordinating and controlling testing of a plurality of devices under test (DUTs) and a hardware interface module coupled to the test computer system and controlled by the test computer system, the hardware interface module operable to apply test input signals to the plurality of DUTs and operable to receive test output signals from the plurality of DUTs. The hardware interface module includes a memory for storing instructions and data, a high performance processor coupled to the memory, the high performance processor operable to perform testing functionality at high speed for application of test signals to the plurality of DUTs, the high performance processor operable to perform the testing functionality under control of instructions and data from the memory and under control from software commands from the test computer system, wherein further the high performance processor is not natively capable of low power mode operation. The test system also includes a low power module coupled to and external to the high performance processor, the low power module capable of operating in at least one low power mode, the high performance processor for directing the low power module to configure the plurality of DUTs into at least one low power mode and further for testing the plurality of DUTs using commands and data in low power. The test system further includes driver hardware for applying the commands and data in low power to the plurality of DUTs (Continued)

100

Test Controller 110

CPU 130 ⟷ Memory 132
REFCLK

Low Power Mode Control Logic 120

122 REFCLK Enable

PCIe 135

RETIMER 140
REFCLK
CLKREQ#
Downstream Port

RETIMER 160
REFCLK
CLKREQ#
Downstream Port

SB

Gate 126

PCIe 145

PCIe 165

• • •

124 REFCLK Enable

Upstream Port
DUT 150A
REFCLK
CLKREQ#

Upstream Port
DUT 150N
REFCLK
CLKREQ#

Upstream Port
DUT 140A
REFCLK
CLKREQ#

Upstream Port
DUT 140N
REFCLK
CLKREQ# which are configured for low power operation during the testing.

19 Claims, 4 Drawing Sheets

(56)                    References Cited

U.S. PATENT DOCUMENTS

2020/0355744 A1*  11/2020  Narayanan ..... G01R 31/318552
2021/0025938 A1      1/2021  Poppe et al.

FOREIGN PATENT DOCUMENTS

TW          201606326  A      2/2016
TW          I759656  B        4/2022
TW          495617  B         7/2022

* cited by examiner

300

PROCESSOR TEST PATTERN GENERATION AND APPLICATION FOR TESTER SYSTEMS

RELATED APPLICATIONS

This application claims benefit of, and priority to U.S. Provisional Patent Application 63/407,081, filed Sep. 15, 2022, to De La Puente et al. This application claims benefit of, and priority to U.S. Provisional Patent Application 63/440,607, filed Jan. 23, 2023, to De La Puente et al. This Application is related to U.S. patent application Ser. No. 13/773,569, now U.S. Pat. No. 10,162,007, filed Feb. 21, 2013. This Application is also related to U.S. patent application Ser. No. 15/914,553, now U.S. Pat. No. 11,009,550, filed Mar. 7, 2018. In addition, this Application is related to U.S. patent application Ser. No. 15/982,910, now U.S. Pat. No. 10,288,681, filed May 17, 2018. This Application is further related to U.S. patent application Ser. Nos. 17/135, 731 and 17/135,790, filed Dec. 28, 2020. All such applications are hereby incorporated herein by reference in their entireties.

FIELD OF INVENTION

Embodiments of the present invention relate to the field of manufacturing and test of electronics. More specifically, embodiments of the present invention relate to systems and methods for processor test pattern generation and application for tester systems.

BACKGROUND

Automated test equipment (ATE) can be any testing assembly that performs a test on a semiconductor device or electronic assembly. ATE assemblies may be used to execute automated tests that quickly perform measurements and generate test results that can then be analyzed. An ATE assembly may comprise a complex automated test assembly that may include a custom, dedicated computer control system and many different test instruments that are capable of automatically testing electronics parts and/or semiconductor wafer testing, such as system-on-chip (SOC) testing, integrated circuit testing, network interfaces, and/or solid state drives (SSDs). ATE systems both reduce the amount of time spent on testing devices to ensure that the device functions as designed and serve as a diagnostic tool to determine the presence of faulty components within a given device before it reaches the consumer.

Testing of Devices Under Test (DUTs) generally comprises sending a series of test patterns or "vectors" to stimulate a device, and collecting the device's responses. For complex assemblies, e.g., network interfaces, Universal Serial Bus (USB) adapters, and/or SSDs, such test patterns may take the form of high-level instructions, e.g., "read" or "write," sector addresses, and "data." Under the conventional art, patterns and workloads used to test device have been generated in hardware using an Algorithmic Pattern Generator (APG) and a hardware accelerator. For example, a hardware-based APG would generate a pattern of data, send an instruction to, e.g., an SSD, to write the data to a particular address or range of addresses, and read back the data. The APG would typically collect performance data on the transaction, and compare the written data to the received data to detect errors. This allowed the test systems to generate data at maximum speed of the DUT where the tester did not become the bottleneck.

In addition, under the conventional art, many DUTs operate on a standard "peripheral" interface, for example, Serial Attached SCSI (SAS), Serial AT Attachment (SATA), Serial Peripheral Interface (SPI), Inter-Integrated Circuit (I2C), Universal Serial Bus (USB), and the like. Such interfaces typically require conversion electronics from a more general purpose "main" or "processor" bus, e.g., Peripheral Component Interconnect Express (PCIe).

These designs were typically implemented in a Field-Programmable Gate Array (FPGA) to achieve faster time to market and design flexibility.

Commensurate with their increasing performance, more and more computer peripherals are abandoning specialized bus interfaces and adopting "main" bus interfaces, e.g., PCIe. For example, high performance SSDs are migrating from serial AT attachment (SATA) interfaces to "M.2" PCIe interfaces. The FPGAs used in the conventional art testers are incapable of keeping up with the increased data rates required for testing of such emerging devices, and the FPGAs are further challenged to implement main bus protocols, e.g., PCIe "Generation 5" and/or PCIe CXL.

SUMMARY OF THE INVENTION

Therefore, what is needed are systems and methods processor test pattern generation and application for tester systems. What is additionally needed are tester systems and test methods for processor test pattern generation and application for tester systems that are able to test high capacity and high bandwidth devices. There is also a need for processor test pattern generation and application for tester systems able to test devices attached to a main bus. There is a further need for systems and methods for processor test pattern generation and application for tester systems that are compatible and complementary with existing systems and methods of testing electronic devices.

In accordance with embodiments of the present invention, a processor generates test patterns via software and applies such test patterns to a device under test (DUT). The test pattern may be communicated to the DUT via direct memory access (DMA), in some embodiments.

Embodiments in accordance with the present invention utilize high performance CPUs. Embodiments in accordance with the present invention may utilize an HCC processor (as one example) instead of ASIC or FPGA devices, as utilized by conventional systems, to generate high speed patterns, thereby providing equivalent levels of performance. The invention provides power and performance scalability currently not possible with typical ATE hardware and also leverages existing hardware for other ATE functions. HCC is a high performance processor. Additional advantages are that the CPUs are not hardware limited, in contrast to hardware-based designs, e.g., ASIC of FPGA based designs. CPU provides increased flexibility and customization not provided by FPGA or ASIC.

In accordance with an embodiment of the present invention, a tester system includes a test computer system for coordinating and controlling testing of a plurality of devices under test (DUTs), and a hardware interface board coupled to the test computer system and controlled by the test computer system, the hardware interface board operable to apply test input signals to the plurality of DUTs and operable to receive test output signals from the plurality of DUTs, the hardware interface board including a memory for storing instructions and data, a high core count (HCC) processor coupled to the memory, the HCC processor operable to automatically generate Automatic Test Pattern Generated (ATPG) test vectors for application to the plurality of DUTs, the HCC processor operable to automatically generate the ATPG test vectors under control of instructions and data from the memory and under control from software commands from the test computer system, wherein ATPG generation of the HCC processor is software reprogrammable under program control, and driver hardware for receiving the test vectors and for driving the test input signals to the plurality of DUTs.

Embodiments include the above and further include wherein the high performance processor is a high core count (HCC) processor.

Embodiments include the above and further include wherein the HCC processor comprises between 16 and 32 cores.

Embodiments include the above and further include wherein the HCC processor supports PCIe protocol and wherein the hardware interface board communicates with the plurality of DUTs using PCIe.

Embodiments include the above and further include wherein the HCC processor comprises N number of cores and wherein N is scalable based on a prescribed testing performance.

Embodiments include the above and further include wherein the instructions stored in the memory are programmable by the computer system and wherein further the instructions control operation of the high performance processor.

In accordance with a another embodiment of the present invention, a tester system includes a test computer system for coordinating and controlling testing of a plurality of devices under test (DUTs), and a hardware interface board coupled to the test computer system and controlled by the test computer system, the hardware interface board operable to apply test input signals to the plurality of DUTs and operable to receive test output signals from the plurality of DUTs, the hardware interface board includes a memory for storing instructions and data, a first high performance central processing unit (CPU) coupled to the memory, the first high performance CPU operable to automatically generate Automatic Test Pattern Generated (ATPG) test vectors for application to a first plurality of DUTs, the first high performance CPU operable to automatically generate the ATPG test vectors under control of instructions and data from the memory and under control from software commands from the test computer system, wherein ATPG generation of the first high performance CPU is software reprogrammable under program control, a second high performance central processing unit (CPU) coupled to the memory, the second high performance CPU operable to automatically generate Automatic Test Pattern Generated (ATPG) test vectors for application to a second plurality of DUTs, the second high performance CPU operable to automatically generate the ATPG test vectors under control of instructions and data from the memory and under control from software commands from the test computer system, wherein ATPG generation of the second high performance CPU is software reprogrammable under program control, and driver hardware for receiving the test vectors from the first and second high performance CPUs and driving the test input signals to the plurality of DUTs.

Embodiments include the above and further include wherein the instructions stored in the memory are programmable by the test computer system and wherein further the instructions control operation of the first and second high performance CPUs Embodiments include the above and further include wherein the first high performance CPU comprises a high core count (HCC) CPU and wherein further the second high performance CPU comprises an HCC CPU.

Embodiments include the above and further include wherein the first high performance CPU comprises between 16 and 32 cores and wherein further the second high performance CPU comprises between 16 and 32 cores Embodiments include the above and further include wherein the HCC processor comprises N number of cores and wherein N is scalable based on a prescribed testing performance.

Embodiments include the above and further include wherein the HCC processor supports PCIe protocol and wherein the hardware interface board communicates with the plurality of DUTs using PCIe.

Embodiments include the above and further include wherein the plurality of DUTs are memory devices.

In accordance with a method embodiment of the present invention, a method of generating and applying test patterns for tester systems, the method includes generating a test pattern for a device under test (DUT) via software operating on a processor, storing the test pattern into a memory attached to the processor, and sending the test pattern from the memory to the DUT.

Embodiments include the above and further include wherein the DUT is attached to a PCIe bus.

Embodiments include the above and further include wherein the processor is a high core count (HCC) processor.

Embodiments include the above and further include wherein the HCC processor comprises between 16 and 32 cores.

Embodiments include the above and further include wherein the HCC processor comprises N number of cores and wherein N is scalable based on a prescribed testing performance.

Embodiments include the above and further include wherein the sending comprises a direct memory access (DMA) transfer from the memory.

Embodiments include the above and further include wherein the software is stored in the memory.

Embodiments include the above and further include wherein the memory is configured to communicate with the processor independent of a system bus, e.g., PCIe.

In accordance with embodiments of the present invention, A non-transitory computer-readable medium includes instructions stored thereon that, responsive to execution by an electronic system, cause the electronic system to perform operations to test a plurality of devices under test (DUTs) while in low power mode. The operations include generating a test pattern for a device under test (DUT) via software operating on a processor, storing the test pattern into a memory attached to the processor, and sending the test pattern from the memory to the DUT.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings may not be drawn to scale.

5

Figure 2:
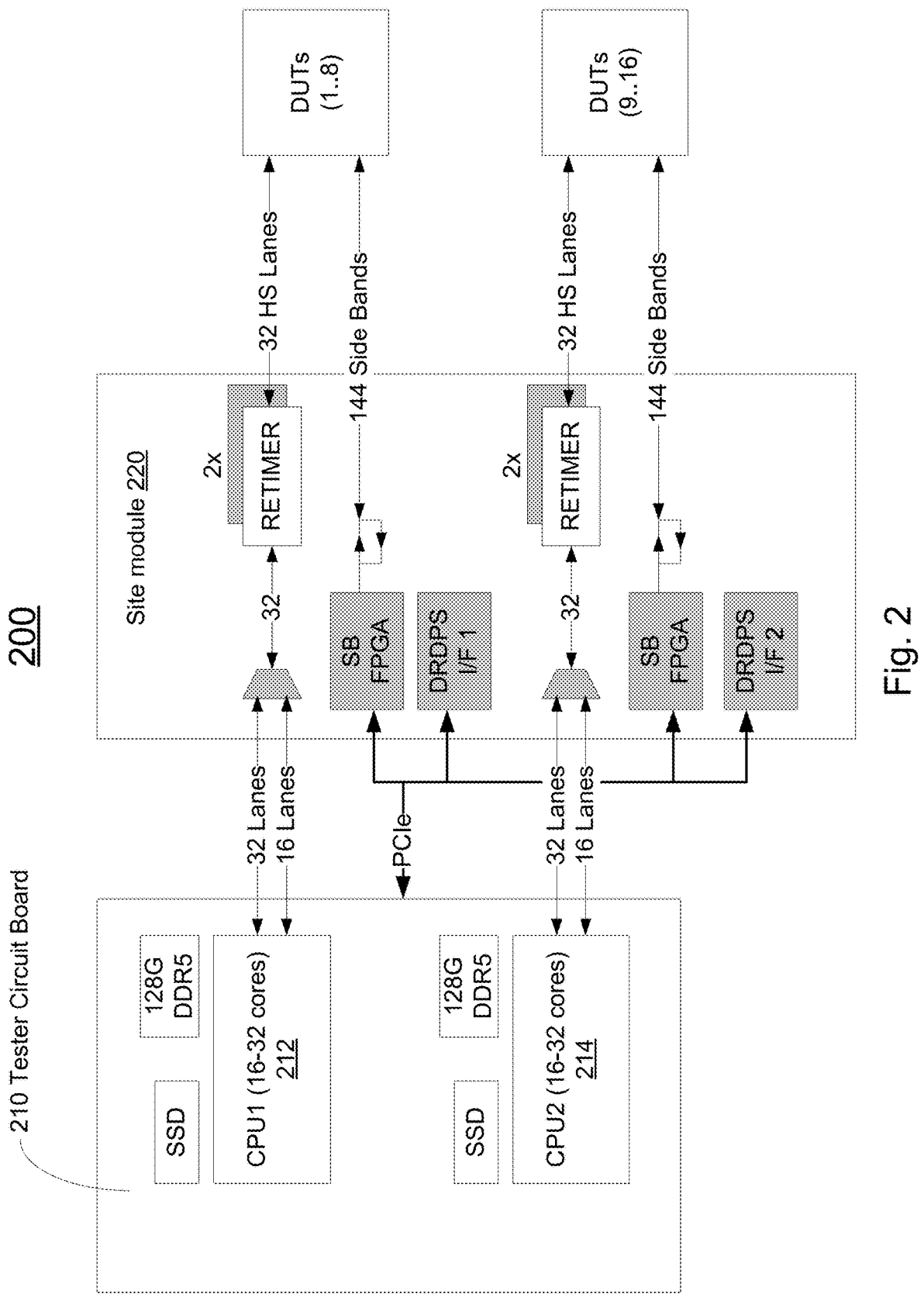

FIG. 2 illustrates a block diagram of an exemplary system for low power environment for high performance processor without low power mode, in accordance with embodiments of the present invention.

Figure 3:
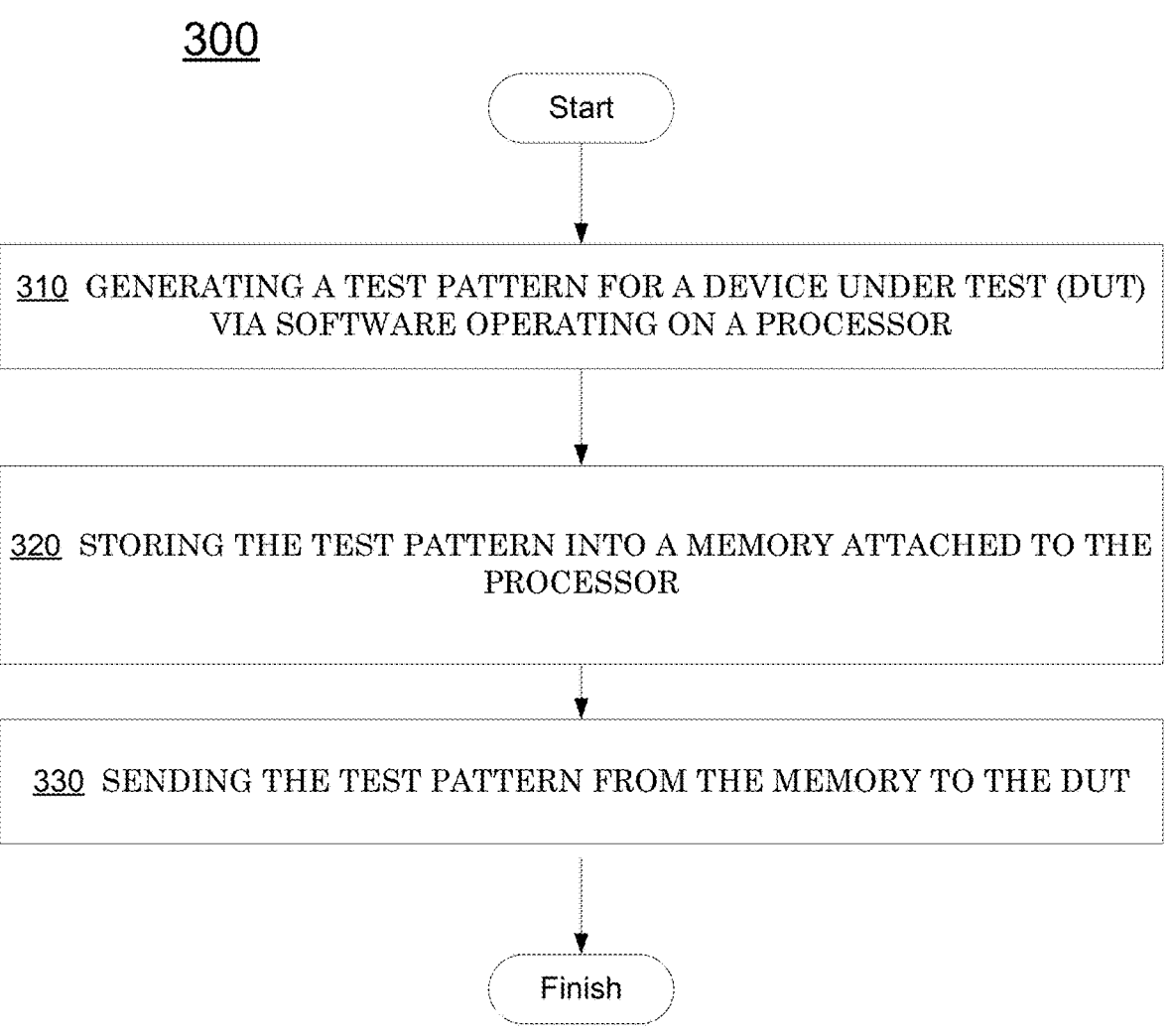

FIG. 3 illustrates an exemplary method of processor test pattern generation and application for tester systems, in accordance with embodiments of the present invention.

Figure 4:
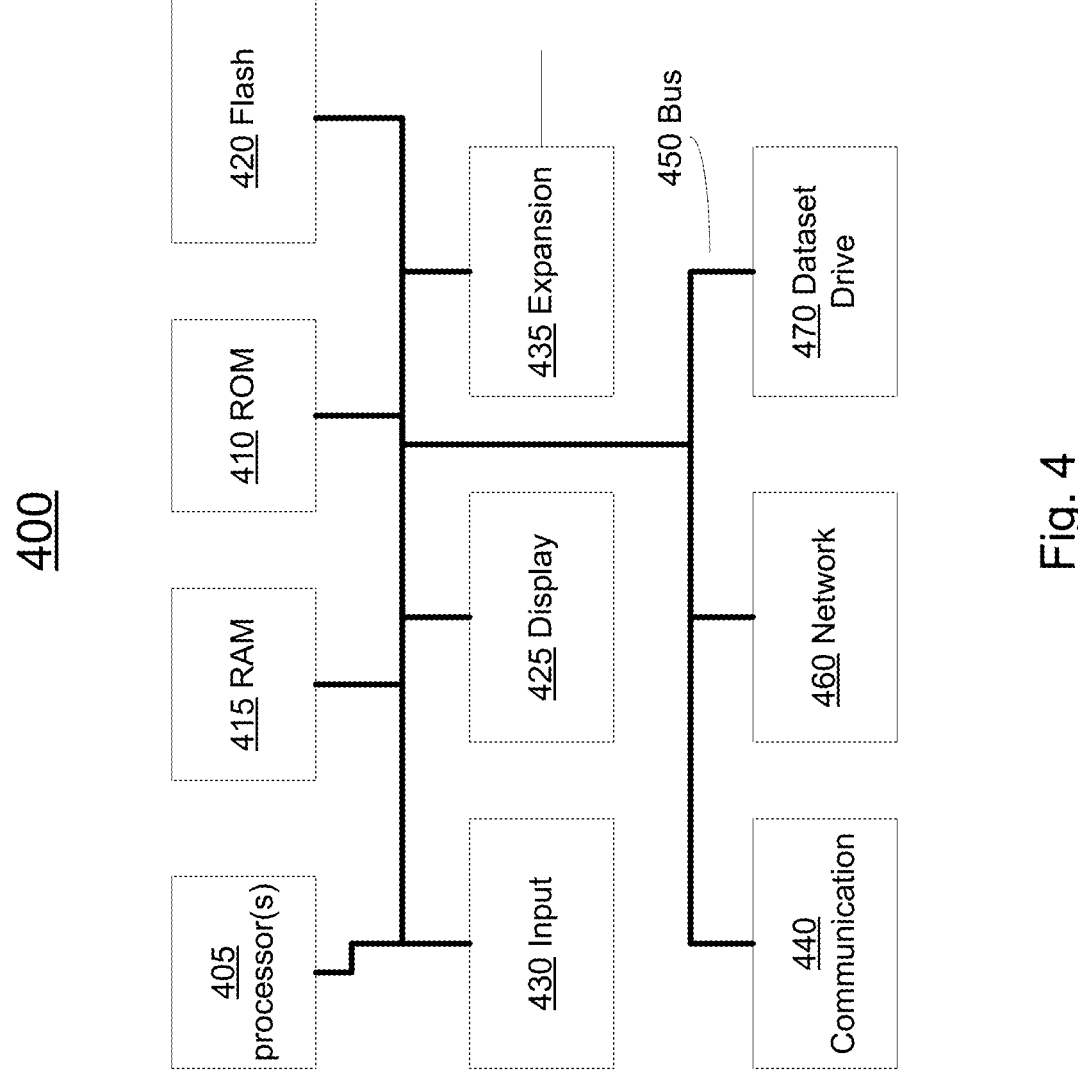

FIG. 4 illustrates a block diagram of an exemplary electronic system, which may be used as a platform to implement and/or as a control system for embodiments of the present invention.

DETAILED DESCRIPTION

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Some portions of the detailed descriptions which follow (e.g., method 300) are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, data, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "applying" or "controlling" or "generating" or "testing" or "heating" or "bringing" or "capturing" or "storing" or "reading" or "analyzing" or "resolving" or "accepting" or "selecting" or "determining" or "displaying" or "presenting" or "computing" or "sending" or "receiving" or "reducing" or "detecting" or "setting" or "accessing" or "placing" or "forming" or "mounting" or "removing" or "ceasing" or "stopping" or "coating" or "processing" or "performing" or "adjusting" or "creating" or "executing" or "continuing" or "indexing" or "translating" or "calculating" or "measuring" or "gathering" or "running" or the like, refer to the action and processes of, or under the control of, a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The meaning of "non-transitory computer-readable medium" should be construed to exclude only those types of transitory computer-readable media which were found to fall outside the scope of patentable subject matter under 35 U.S.C. § 101 in In re Nuijten, 500 F.3d 1346, 1356-57 (Fed. Cir. 2007). The use of this term is to be understood to remove only propagating transitory signals per se from the claim scope and does not relinquish rights to all standard computer-readable media that are not only propagating transitory signals per se.

In the following descriptions, various elements and/or features of embodiments in accordance with the present invention are presented in isolation so as to better illustrate such features and as not to unnecessarily obscure aspects of the invention. It is to be appreciated, however, that such features, e.g., as disclosed with respect to a first drawing, may be combined with other features disclosed in other drawings in a variety of combinations. All such embodiments are anticipated and considered, and may represent embodiments in accordance with the present invention.

Exemplary embodiments in accordance with the present invention are generally presented herein as relating to a Peripheral Component Interconnect Express (PCIe) computer expansion bus standard. It is to be appreciated that embodiments in accordance with the present invention are not limited to the illustrated PCIe embodiments. Rather, embodiments in accordance with the present invention are well suited to use with a wide range of other well-known computer expansion busses, including, for example, Compute Express Link (CXL), InfiniBand, RapidIO, Hyper-Transport, Intel QuickPath Interconnect, VMEbus (ANSI/IEEE 1014-1987), and/or Mobile Industry Processor Interface (MIPI), and such embodiments are considered within the scope of the present invention.

Processor Test Pattern Generation and Application for Tester Systems

Figure 1:
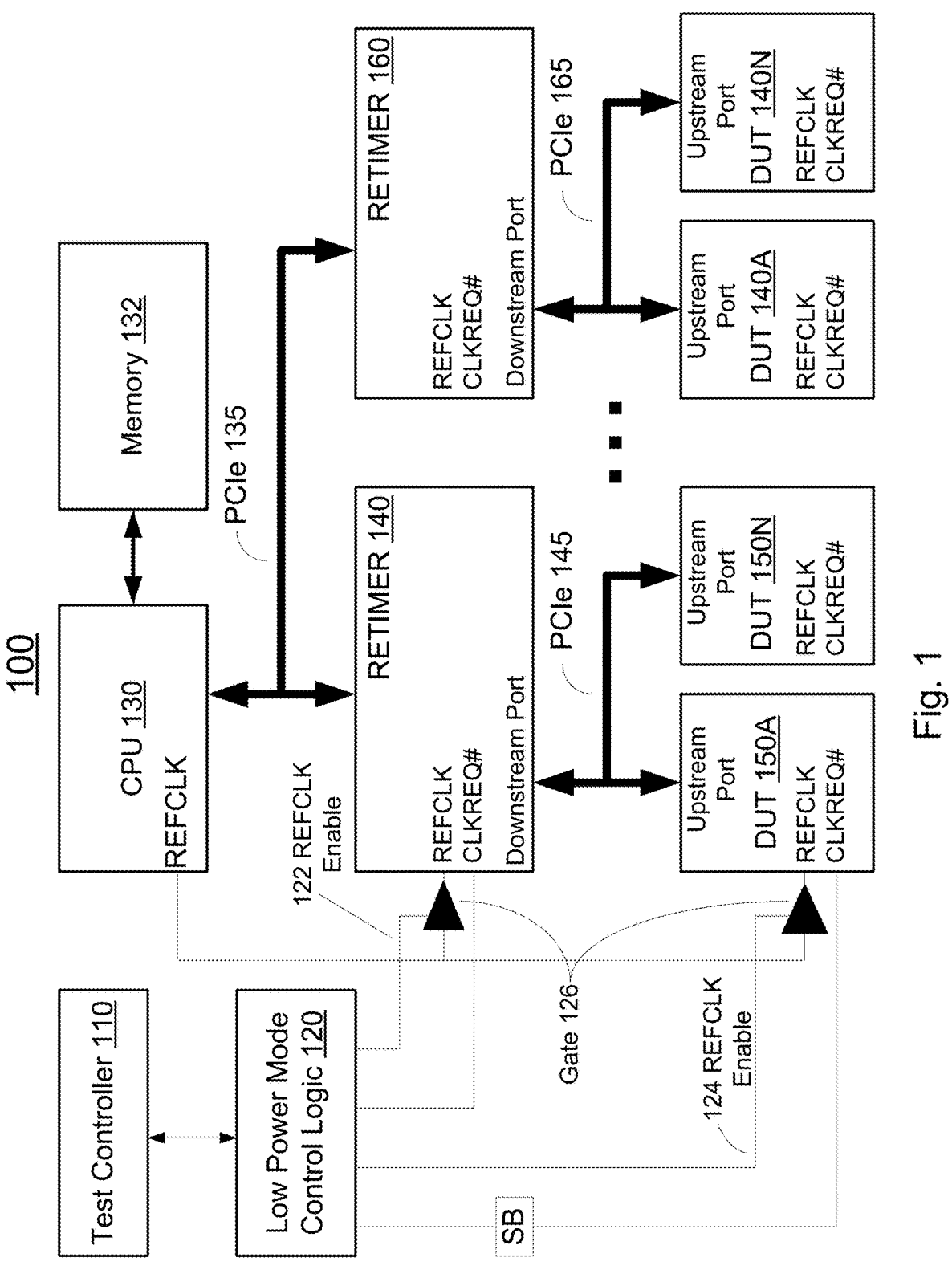
FIG. 1 illustrates an exemplary block diagram of an exemplary system for low power environment for high performance processor without low power mode, in accordance with embodiments of the present invention.

FIG. 1 illustrates an exemplary block diagram of an exemplary system 100 for low power environment for high performance processor without low power mode, in accordance with embodiments of the present invention. Test system 100 comprises a test controller 110, which may be, for example, a general-purpose computer system with special programming for the test application. Test system 100 also comprises a CPU 130. CPU 130 may comprise bus, e.g., PCIe, support components, including additional integrated circuit devices, in some embodiments. CPU 130 may be known as or referred to as "server," "workstation," "High Core Count (HCC)," and/or "enterprise" processors. One example of such a processor is the Intel® Xeon® "Sapphire Rapids" family of processors. CPU 130 may comprise 16 to 32 cores, in some embodiments. In some embodiments, CPU 130 may comprise more than 32 cores. For example, processors comprising 56 cores are currently available. In some embodiments, the number of cores in CPU 130 may be scalable, or selected, based on a prescribed testing performance.

CPU 130 is coupled to memory 132. Memory 132 may comprise high bandwidth memory (HBM), in some embodiments. Memory 132 may be coupled to CPU 130 in any well-known manner. For example, memory 132 may be directly coupled to CPU 130, memory 132 may be coupled to CPU 130 via a "chip set," and/or memory 132 may be coupled to CPU 130 via bus 135.

CPU 130 is functionally coupled to PCIe bus 135. CPU 130, or other associated bus control components, may generate a signal REFCLK, in some embodiments. In some embodiments, REFCLK may be provided by other sources, e.g., a clock module, as is known for a variety of PCIe embodiments.

The PCIe standard specifies a 100 MHz clock (REFCLK) with at least ±300 ppm frequency stability for Generation 1, 2, 3 and 4, and at least ±100 ppm frequency stability for Generation 5, at both the transmitting and receiving devices. As will be further discussed below, REFCLK plays an important role in PCIe low power modes.

CPU 130 is coupled via PCIe bus 135 to a plurality of retimers, e.g., retimers 140, 160. The number of retimers illustrated is exemplary. In general, PCIe retimers are signal conditioning devices that actively participate in the PCIe protocol to facilitate communication between a root complex, e.g., PCIe bus 135, and an endpoint, e.g., PCIe bus 145. By providing improved signal integrity in a system, retimers increase the maximum allowable PCIe trace length and allow for more flexibility in system design. Exemplary retimers may include the PT5161L PCI Express® Retimer, commercially available from Astera Labs, Santa Clara, California, USA.

The retimer 140 produces PCIe bus 145, which functionally mirrors PCIe bus 135. For example, devices coupled to PCIe bus 145 are functionally coupled to devices on PCIe bus 135, e.g., CPU 130. Similarly, retimer 160 produces PCIe bus 165, which functionally mirrors PCIe bus 135.

A plurality of devices under test (DUTs), e.g., DUT 150A to DUT 150N, are coupled to PCIe bus 145. Similarly, a devices under test (DUTs), e.g., DUT 150A to DUT 150N, are coupled to PCIe bus 165. In some embodiments, eight DUTs may be coupled to a single CPU, e.g., CPU 130. In some embodiments, additional CPUs may be coupled to additional retimers and additional DUTs in a similar manner as illustrated in FIG. 1. For example, in a two CPU embodiment, there may be four retimers, e.g., two per CPU, and 16 DUTs, e.g., eight per CPU.

CPU 130 is configured, e.g., via software, to test the electrical and functional performance and characteristics of a device under test, e.g., DUT 150A. For example, CPU generates data and commands to be sent to a DUT, and receives results from the DUT.

In an exemplary Solid State Drive (SSD) DUT embodiment, CPU 130 may issue a "write" command to a SSD DUT, via PCIe bus 135. The CPU 130 may send, or write, a large amount of data to the SSD to be saved by the SSD. The CPU 130 may generate the data via an algorithm, or algorithmic pattern generator (APG) software operating on the CPU 130, in some embodiments. In some embodiments, the CPU 130 may access the data from a computer readable media, e.g., DRAM, coupled to the CPU 130. The CPU 130 will typically issue a "read" command to the SSD to read back the data previously written. In some embodiments, the CPU 130 may cause data to be sent and/or received directly from/to a memory to/from a DUT, e.g., via direct memory access (DMA). The CPU 130 may compare the data sent to the SSD with the data received from the SSD to confirm correct operation and/or to determine erroneous operation of the SSD.

In some embodiments, test system 100 may also perform electrical, power, and/or environmental testing on the plurality of DUTs. Such testing is known in the MPT3000ARC test system, commercially available from Advantest America, Inc., of San José, California, USA.

Test system 100 is well-suited to testing any device that is adapted to operate on the main bus, e.g., a PCIe bus. Such exemplary devices may include, for example, SSDs, DRAM modules, interfaces to rotating media, e.g., optical drives and magnetic hard drives (HDDs), RAID (Redundant Array of Independent Disks) controllers, network interface cards (NICs), including LAN, e.g., WIFI, wide area network (WAN), and/or fiber-optic interconnects, graphics cards, sound cards, modems, scanners, video capture cards, USB interfaces, Secure Digital (SD) Card interfaces, TV tuners, and the like.

PCIe Generation 5 has implemented what is known as or referred to as "L1 sub-states" to its power control regime. A new function is added to the PCIe pin "CLKREQ #" to provide a signaling protocol. This allows the PCIe transceivers to turn off their high-speed circuits and rely on the new signaling to wake them up again. Two new sub-states were defined: L1.1 and L1.2 providing their own power vs. exit latency trade-off choices. The L1.1 sub-state is intended for resumption times on the order of 20 microseconds (5 to 10 times longer than the L1 state allowed), while the L1.2 sub-state targets times on the order of 100 microseconds (up to 50 times longer than allowed for L1). Both L1.1 and L1.2 permit the PCIe transceivers to turn off their phase locked loops (PLLs) along with their receivers and transmitters, while L1.2 allows turning off common mode keeper circuits.

To implement the L1.1 and/or the L1.2 low power states, both the "upstream" and "downstream" ports may monitor the logical state of the CLKREQ #signal. It is appreciated that CPU 130 does not support the L1 low power sub-states (L1.1, L1.2). CPU 130 is not illustrated as accessing the CLKREQ #signal/pin. Hence, CPU 130 cannot natively support the L1.1 and/or L1.2 low power modes. However, a wide range of computer peripheral devices want to take advantage of the L1 low power sub-states. For example, such devices are intended for use in systems for which power consumption is important, e.g., in laptop computer systems. In order to test these devices, test system 100 comprises low power mode control logic 120.

Low power mode control logic 120 exists separately from CPU 130, and may be controlled by test controller 110, in some embodiments. Low power mode control logic 120 functions to control the reference clock REFCLK in response to the CLKREQ #signal. Low power mode control logic 120 comprises storage locations, e.g., register bits, to indicate whether the L1 sub-states are enabled. These registers are further described with respect to FIG. 5, below. If the L1.1 state is enabled and the L1.2 state is not enabled, low power mode control logic 120 will respond to deassertion of the CLKREQ #signal by disabling the REFCLK using and by disabling Electrical Idle detect circuits. Any device on the PCIe bus, e.g., retimer 140 and/or DUT 150A, may request a L1 sub-state low power mode by deasserting CLKREQ #. In some embodiments, test controller 110 may command low power mode control logic 120 to enter a L1 sub-state low power mode by deasserting CLKREQ #. In response to the deassertion of CLKREQ #, low power mode control logic 120 will deassert signals 122 and 124 REFCLK enable, which will turn off gates 126, and not allow the REFCLK signal to propagate to the devices, e.g., retimer 140 and/or DUT 150A. In some embodiments, gates 126 may be tri-state buffers.

If the L1.2 enable bit is set, the L1.2 sub-state is entered in response to deassertion of the CLKREQ #signal.

Test system 100 may perform a variety of tests and/or measurements related to a DUT entering and exiting a low power mode. For example, test system 100 may measure power consumption while a DUT is in low power mode. Test system 100 may also measure latency for a DUT to come out of low power mode(s) until the DUT is partially and/or fully functional. It is appreciated that CPU 130 may not implement and/or execute a variety of low power modes while testing a plurality of DUTs. For example, CPU 130 may be required to execute instructions and/or perform other operations while a DUT is in low power mode.

Under the conventional art, DUTs were coupled to a hardware bus adapter socket which converted a main computer expansion bus, e.g., PCIe, to a more specialized peripheral bus, e.g., Universal Serial Bus (USB), Serial Attached SCSI (SAS), and/or Serial AT Attachment (SATA) etc., as used by the DUT. In accordance with embodiments of the present invention, a DUT is coupled to a main computer expansion bus, e.g., PCIe.

FIG. 2 illustrates a block diagram of an exemplary system 200 for low power environment for high performance processor without low power mode, in accordance with embodiments of the present invention. System 200 is similar to system 100, and may be functionally equivalent, in some embodiments. System 200 comprises a tester circuit board 210. Tester circuit board 210 comprises two processors, CPU1 212 and CPU2 214. CPU1 212 and CPU2 214 may be similar to or equivalent to CPU 130 (FIG. 1), in some embodiments. Tester circuit board 210 is coupled to a site module 220 via a plurality of PCIe busses. As illustrated in FIG. 2, each CPU1 212 and CPU2 214 is coupled to site module 220 by 32 and 16 bit wide lanes.

Site module 220 accesses the PCIe lanes to generate 32 high speed (HS) lanes to a plurality of DUTs. Site module 220 may utilize a plurality of retimers, e.g., retimers 140, 160, as described with respect to FIG. 1, to generate the high speed lanes.

As illustrated, system 200 is configured to test up to 16 DUTs, e.g., up to eight DUTs per CPU, and up to 16 DUTs per site module 220. A tester system may utilize up to eight site modules, corresponding to 16 CPUs, to simultaneously test up to 128 bus-attached DUTs.

In accordance with embodiments of the present invention, CPU 130 (FIG. 1) and/or CPU1 212 and CPU2 214 generates test patterns under software control, including, for example, commands and test data, to test a DUT, e.g., DUT 150A (FIG. 1). The test patterns may be sent to a DUT via direct memory access (DMA), in some embodiments. It is appreciated that the amount of data and data transfer rates in accordance with embodiments of the present invention are significantly faster that was achievable under the conventional art.

In an embodiment, a DUT is accessed via a PCIe bus. More specifically, the DUT is not accessed via a specialized "peripheral" interface, e.g., Serial Attached SCSI (SAS), Serial AT Attachment (SATA), Serial Peripheral Interface (SPI), Inter-Integrated Circuit (I2C), Universal Serial Bus (USB), or the like. Beneficially, an interface circuit between a PCIe bus and such a specialized "peripheral" interface is not present or required. Such an interface circuit, e.g., a PCIe to SATA interface circuit, deleteriously limits the hardware flexibility of a test environment. For example a USB device cannot be tested on a SATA interface. In addition, such an interface circuit will typically limit the bandwidth of a test, due to, for example, the capabilities of the interface circuit hardware and/or the limits of the specialized "peripheral" interface itself.

FIG. 3 illustrates an exemplary method 300 of processor test pattern generation and application for tester systems, in accordance with embodiments of the present invention. In 310, a test pattern for a device under test (DUT) is generated via software operating on a processor.

In 320, the test pattern is stored into a memory attached to the processor. In 330, the test pattern is sent from the memory to the DUT.

FIG. 4 illustrates a block diagram of an exemplary electronic system 400, which may be used as a platform to implement and/or as a control system, e.g., system controller 110 and/or CPU 130, as described in FIG. 1, for embodiments of the present invention. Electronic system 400 may be a "server" computer system, in some embodiments. Electronic system 400 includes an address/data bus 450 for communicating information, a central processor complex 405 functionally coupled with the bus for processing information and instructions. Bus 450 may comprise, for example, a Peripheral Component Interconnect Express (PCIe) computer expansion bus, industry standard architecture (ISA), extended ISA (EISA), MicroChannel, Multibus, IEEE 796, IEEE 1196, IEEE 1496, PCI, Computer Automated Measurement and Control (CAMAC), MBus, Runway bus, Compute Express Link (CXL), and the like.

Central processor complex 405 may comprise a single processor or multiple processors, e.g., a multi-core processor, or multiple separate processors, in some embodiments. Central processor complex 405 may comprise various types of well-known processors in any combination, including, for example, digital signal processors (DSP), graphics processors (GPU), complex instruction set (CISC) processors, reduced instruction set (RISC) processors, and/or very long word instruction set (VLIW) processors. In some embodiments, exemplary central processor complex 405 may comprise a finite state machine, for example, realized in one or more field programmable gate array(s) (FPGA), which may operate in conjunction with and/or replace other types of processors to control embodiments in accordance with the present invention.

Electronic system 400 may also include a volatile memory 415 (e.g., random access memory RAM) coupled with the bus 450 for storing information and instructions for the central processor complex 405, and a non-volatile memory 410 (e.g., read only memory ROM) coupled with the bus 450 for storing static information and instructions for the processor complex 405. Electronic system 400 also optionally includes a changeable, non-volatile memory 420 (e.g., NOR flash) for storing information and instructions for the central processor complex 405 which can be updated after the manufacture of system 400. In some embodiments, only one of ROM 410 or Flash 420 may be present.

Also included in electronic system 400 of FIG. 4 is an optional input device 430. Device 430 can communicate information and command selections to the central processor 400. Input device 430 may be any suitable device for communicating information and/or commands to the electronic system 400. For example, input device 430 may take the form of a keyboard, buttons, a joystick, a track ball, an audio transducer, e.g., a microphone, a touch sensitive digitizer panel, eyeball scanner, and/or the like.

Electronic system 400 may comprise a display unit 425. Display unit 425 may comprise a liquid crystal display (LCD) device, cathode ray tube (CRT), field emission device (FED, also called flat panel CRT), light emitting diode (LED), plasma display device, electro-luminescent display, electronic paper, electronic ink (e-ink) or other display device suitable for creating graphic images and/or alphanumeric characters recognizable to the user. Display unit 425 may have an associated lighting device, in some embodiments.

Electronic system 400 also optionally includes an expansion interface 435 coupled with the bus 450. Expansion interface 435 can implement many well known standard expansion interfaces, including without limitation the Secure Digital Card interface, universal serial bus (USB) interface, Compact Flash, Personal Computer (PC) Card interface, CardBus, Peripheral Component Interconnect (PCI) interface, Peripheral Component Interconnect Express (PCI Express), mini-PCI interface, IEEE 1394, Small Computer System Interface (SCSI), Personal Computer Memory Card International Association (PCMCIA) interface, Industry Standard Architecture (ISA) interface, RS-232 interface, and/or the like. In some embodiments of the present invention, expansion interface 435 may comprise signals substantially compliant with the signals of bus 450.

A wide variety of well-known devices may be attached to electronic system 400 via the bus 450 and/or expansion interface 435. Examples of such devices include without limitation rotating magnetic memory devices, flash memory devices, digital cameras, wireless communication modules, digital audio players, and Global Positioning System (GPS) devices.

System 400 also optionally includes a communication port 440. Communication port 440 may be implemented as part of expansion interface 435. When implemented as a separate interface, communication port 440 may typically be used to exchange information with other devices via communication-oriented data transfer protocols. Examples of communication ports include without limitation RS-232 ports, universal asynchronous receiver transmitters (UARTs), USB ports, infrared light transceivers, ethernet ports, IEEE 1394, and synchronous ports.

System 400 optionally includes a network interface 460, which may implement a wired or wireless network interface. Electronic system 400 may comprise additional software and/or hardware features (not shown) in some embodiments.

Various modules of system 400 may access computer readable media, and the term is known or understood to include removable media, for example, Secure Digital ("SD") cards, CD and/or DVD ROMs, diskettes and the like, as well as non-removable or internal media, for example, hard drives, solid state drive s (SSD), RAM, ROM, flash, and the like.

Embodiments in accordance with the present invention provide systems and methods for processor test pattern generation and application for tester systems. In addition, embodiments in accordance with the present invention provide systems and methods processor for test pattern generation and application for tester systems that are able to test high capacity and high bandwidth devices. Additional embodiments in accordance with the present invention provide systems and methods for processor test pattern generation and application for tester systems that are able to test devices attached to a main bus. Further, embodiments in accordance with the present invention provide embodiments in accordance with the present invention provide systems and methods processor for test pattern generation and application for tester systems that are able to test that are compatible and complementary with existing systems and methods of testing electronic devices.

Although the invention has been shown and described with respect to a certain exemplary embodiment or embodiments, equivalent alterations and modifications will occur to others skilled in the art upon the reading and understanding of this specification and the annexed drawings. In particular regard to the various functions performed by the above described components (assemblies, devices, etc.) the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

Various embodiments of the invention are thus described. While the present invention has been described in particular embodiments, it should be appreciated that the invention should not be construed as limited by such embodiments, but rather construed according to the below claims.

What is claimed is:

1. A tester system comprising:
   a test computer system for coordinating and controlling testing of a plurality of devices under test (DUTs); and
   a hardware interface board coupled to said test computer system and controlled by said test computer system, said hardware interface board operable to apply test input signals to said plurality of DUTs and operable to receive test output signals from said plurality of DUTs, said hardware interface board comprising:
   a memory for storing instructions and data;
   a high core count (HCC) processor coupled to said memory, said HCC processor operable to automatically generate Automatic Test Pattern Generated (ATPG) test vectors for application to said plurality of DUTs, said HCC processor operable to automatically generate said ATPG test vectors under control of instructions and data from said memory and under control from software commands from said test computer system, wherein ATPG generation of said HCC processor is software reprogrammable under program control; and
   driver hardware for receiving said test vectors and for driving said test input signals to said plurality of DUTs.

2. The tester system as described in claim 1 wherein said HCC processor comprises between 16 and 32 cores.

3. The tester system as described in claim 1 wherein said HCC processor supports PCIe protocol and wherein said hardware interface board communicates with said plurality of DUTs using PCIe.

4. The tester system as described in claim 1 wherein said HCC processor comprises N number of cores and wherein N is scalable based on a prescribed testing performance.

5. The tester system as described in claim 1 wherein said instructions stored in said memory are programmable by said test computer system and wherein further said instructions control operation of said HCC processor.

6. A tester system comprising:
   a test computer system for coordinating and controlling testing of a plurality of devices under test (DUTs); and
   a hardware interface board coupled to said test computer system and controlled by said test computer system, said hardware interface board operable to apply test input signals to said plurality of DUTs and operable to receive test output signals from said plurality of DUTs, said hardware interface board comprising:

a memory for storing instructions and data;

a first high performance central processing unit (CPU) coupled to said memory, said first high performance CPU operable to automatically generate Automatic Test Pattern Generated (ATPG) test vectors for application to a first plurality of DUTs, said first high performance CPU operable to automatically generate said ATPG test vectors under control of instructions and data from said memory and under control from software commands from said test computer system, wherein ATPG generation of said first high performance CPU is software reprogrammable under program control;

a second high performance central processing unit (CPU) coupled to said memory, said second high performance CPU operable to automatically generate Automatic Test Pattern Generated (ATPG) test vectors for application to a second plurality of DUTs, said second high performance CPU operable to automatically generate said ATPG test vectors under control of instructions and data from said memory and under control from software commands from said test computer system, wherein ATPG generation of said second high performance CPU is software reprogrammable under program control; and driver hardware for receiving said test vectors from said first and second high performance CPUs and driving said test input signals to said plurality of DUTs.

7. The tester system as described in claim 6 wherein said instructions stored in said memory are programmable by said test computer system and wherein further said instructions control operation of said first and second high performance CPUs.

8. The tester system as described in claim 6 wherein said first high performance CPU comprises a high core count (HCC) CPU and wherein further said second high performance CPU comprises an HCC CPU.

9. The tester system as described in claim 8 wherein said first high performance CPU comprises between 16 and 32 cores and wherein further said second high performance CPU comprises between 16 and 32 cores.

10. The tester system as described in claim 8 wherein said first high performance CPU comprises N number of cores and wherein further said second high performance CPU comprises a N number of cores wherein Nis scalable based on a prescribed testing performance.

11. The tester system as described in claim 8 wherein the HCC processor supports PCIe protocol and wherein said hardware interface board communicates with said plurality of DUTs using PCIe.

12. A method of generating and applying test patterns for tester systems, the method comprising:

generating a test pattern for a device under test (DUT) via software operating on a processor, wherein the processor is a high core count (HCC) processor;

storing the test pattern into a memory attached to the processor; and sending the test pattern from the memory to the DUT.

13. The method of claim 12 wherein the DUT is attached to a PCIe bus.

14. The method of claim 12 wherein said HCC processor comprises between 16 and 32 cores.

15. The method of claim 12 wherein said HCC processor comprises N number of cores and wherein N is scalable based on a prescribed testing performance.

16. The method of claim 12 wherein said sending comprises a direct memory access (DMA) transfer from said memory.

17. The method of claim 12 wherein said software is stored in said memory.

18. The method of claim 12 wherein said memory is configured to communicate with said processor independent of a system bus.

19. A non-transitory computer-readable medium having instructions stored thereon that, responsive to execution by an electronic system, cause said electronic system to perform operations to test a plurality of devices under test (DUTs) while in low power mode, the operations comprising:

generating a test pattern for a device under test (DUT) via software operating on a processor, wherein the processor is a high core count (HCC) processor;

storing the test pattern into a memory attached to the processor; and sending the test pattern from the memory to the DUT.

* * * * *